United States Patent
Riedel et al.

(10) Patent No.: US 10,529,785 B2
(45) Date of Patent: Jan. 7, 2020

(54) OPTOELECTRONIC COMPONENT AND METHOD FOR OPERATING AN OPTOELECTRONIC COMPONENT

(71) Applicant: OSRAM OLED GmbH, Regensburg (DE)

(72) Inventors: Daniel Riedel, München (DE); Carola Diez, Regensburg (DE); Arne Fleissner, Regensburg (DE); Ulrich Niedermeier, Leiblfing (DE); Dominik Pentlehner, Burghausen (DE); Andreas Rausch, Regensburg (DE); Nina Riegel, Tegernheim (DE); Johannes Rosenberger, Regensburg (DE); Thomas Wehlus, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/747,087

(22) PCT Filed: Jul. 22, 2016

(86) PCT No.: PCT/EP2016/067558
§ 371 (c)(1),
(2) Date: Jan. 23, 2018

(87) PCT Pub. No.: WO2017/013255
PCT Pub. Date: Jan. 26, 2017

(65) Prior Publication Data
US 2018/0374910 A1    Dec. 27, 2018

(30) Foreign Application Priority Data
Jul. 23, 2015   (DE) .................. 10 2015 112 048

(51) Int. Cl.
*H01L 27/32* (2006.01)
*H01L 51/50* (2006.01)
(Continued)

(52) U.S. Cl.
CPC ...... *H01L 27/3225* (2013.01); *H01L 51/5056* (2013.01); *H01L 51/5072* (2013.01);
(Continued)

(58) Field of Classification Search
CPC ............ H01L 27/3225; H01L 51/5056; H01L 51/5072; H01L 51/529; H01L 2251/556; H05B 33/0896
See application file for complete search history.

(56) References Cited

U.S. PATENT DOCUMENTS 9,451,670 B2    9/2016 Ingle et al.
2002/0145380 A1   10/2002 Aziz et al.
(Continued)

FOREIGN PATENT DOCUMENTS

CN    204090219 U    1/2015
DE    102012109211 A1    6/2014
WO    2009008535 A1    1/2009

OTHER PUBLICATIONS

Vishay, "NPC and PTC Thermistors", Engineering Note, published on vishay.com (Year: 2007).*

*Primary Examiner* — Bilkis Jahan
*Assistant Examiner* — Victor V Barzykin
(74) *Attorney, Agent, or Firm* — Slater Matsil, LLP

(57) ABSTRACT

The invention relates to an optoelectronic component, the optoelectronic component comprises a light-emitting layer stack, and an electrothermal protection element, which is connected to the layer stack in the component and has a temperature-dependent resistor.

11 Claims, 4 Drawing Sheets

(51) Int. Cl.
*H01L 51/52* (2006.01)
*H05B 33/08* (2006.01)

(52) U.S. Cl.
CPC ....... *H01L 51/529* (2013.01); *H05B 33/0896* (2013.01); *H01L 2251/50* (2013.01)

(56) References Cited

U.S. PATENT DOCUMENTS

| | | | |
|---|---|---|---|
| 2011/0115406 A1* | 5/2011 | Wang | H05B 33/0812 315/294 |
| 2012/0205679 A1 | 8/2012 | Hiroki et al. | |
| 2013/0314001 A1* | 11/2013 | Liu | H05B 33/0872 315/297 |
| 2015/0282273 A1* | 10/2015 | Ingle | H01L 51/529 315/309 |

* cited by examiner

OPTOELECTRONIC COMPONENT AND METHOD FOR OPERATING AN OPTOELECTRONIC COMPONENT

This patent application is a national phase filing under section 371 of PCT/EP2016/067558, filed Jul. 22, 2016, which claims the priority of German patent application 10 2015 112 048.8, filed Jul. 23, 2015, each of which is incorporated herein by reference in its entirety.

TECHNICAL FIELD

The invention relates to an optoelectronic component and to a method for operating an optoelectronic component.

BACKGROUND

To protect optoelectronic components, in particular OLEDs, against damage of the material due to overheating during operation, temperature sensors can be used to regulate the operating current depending on the measured temperature. Furthermore, other approaches are followed for active cooling during operation, with cooling bodies or fans being attached to the component, thus substantially defining the outer appearance of the component.

SUMMARY OF THE INVENTION

Embodiments of the invention provide an optoelectronic component having an improved integrated overheating protection for an optoelectronic component.

In various embodiments an optoelectronic component includes a light-emitting layer stack and an electrothermal protection element, which is connected with the layer stack in the component and has a temperature-dependent resistance.

With an electrothermal protection element integrated into the component, the optoelectronic component comprises an overheating protection, by means of which a temperature sensor can advantageously be dispensed with. Operation of the layer stack above a critical temperature can cause irreversible damages to active regions of the layer stack. This can advantageously be prevented, as the electrothermal protection element reduces or stops the operation of the light-emitting layer stack as soon as a critical heating of the layer stack is exceeded. This can extend the service life of the component. The electrothermal protection element can automatically regulate operation of the component, in particular, dim or turn-off light emission at the layer stack. Advantageously, this is achieved in that the electric regulation of the component, e.g., an operating current applied to the layer stack, is controlled depending on the temperature in the layer stack. Besides extending the component's service life, an overall failure of the component can advantageously be prevented.

According to at least one embodiment of the optoelectronic component, the light-emitting layer stack includes organic layers.

The optoelectronic component is advantageously configured as an OLED. The layer stack may include an active zone and may be arranged on a substrate in the component.

According to an embodiment of the optoelectronic component, the electrothermal protection element and the light-emitting layer stack are commonly arranged on a substrate and covered by a common encapsulation.

The encapsulation acts as a cover of the component and mechanically fixes the electrothermal protection element and the light-emitting layer stack in the component. The encapsulation can be formed as a transparent potting and constitute an outer surface of the optoelectronic component. The electrothermal protection element can be arranged on or applied on the substrate together with the layer stack.

According to at least one embodiment of the optoelectronic component, a heat-conducting element is jointly arranged on the substrate between the layer stack and the electrothermal protection element.

The heat-conducting element can advantageously be covered by the encapsulation and mechanically fixed in the optoelectronic component together with the electrothermal protection element and the light-emitting layer stack. Advantageously, the heat-conducting element is in direct contact with the layer stack and the electrothermal protection element. In this way, thermal conduction from the layer stack to the electrothermal protection element can be improved. The heat transferred to the electrothermal protection element advantageously causes that the temperature applied to the electrothermal protection element, advantageously the temperature assumed by the electrothermal protection element, largely corresponds to the temperature of the light-emitting layer stack. Therefore, the temperature-dependent resistance on the electrothermal protection element can be regarded as a measure for the temperature at the light-emitting layer stack, and the operation can be regulated by the electrothermal protection element as required.

The heat-conducting element may be arranged on the substrate and in lateral direction, parallel to a main extension plane of the substrate, between the electrothermal protection element and the light-emitting layer stack. The heat-conducting element may be formed as a layer. Measured from the substrate, the layer may have a height that essentially corresponds to the height of the light-emitting layer stack and/or the height of the electrothermal protection element. In this case, "essentially" can mean that a height difference is at most 20%, or at most 10% of the height of the light-emitting layer stack and/or the height of the electrothermal protection element.

The heat-conducting element comprises side surfaces extending transversely to the main extension plane of the substrate, for example. At least 30% or at least 50% or at least 80% of the side surfaces of the heat-conducting element may be in direct mechanical contact with the light-emitting layer stack and the electrothermal protection element.

The heat-conducting element may include or consist of a heat-conducting material with a thermal conductivity of at least 40 W/(m·K), or at least 100 W/(m·K). The heat-conducting element includes or consists of steel or copper or silver or aluminum or another metal, for example. Also possible for a material of the heat-conducting element are heat-conducting pastes or graphite or graphene or silicon carbide or ceramics.

According to at least one embodiment of the optoelectronic component, the electrothermal protection element includes a positive temperature coefficient (PTC) thermistor switch connected in series to the layer stack.

A PTC thermistor switch is characterized by the fact that it is electrically-conductive when a temperature of the PTC thermistor switch is lower than a predetermined temperature value. Advantageously, the PTC thermistor switch is conductive for temperatures below 120° C., preferably of less than 100°, and particularly preferably of less than 85° C.

In other words, the PTC thermistor switch has a temperature-dependent electric resistance, wherein when exceeding a critical temperature, the PTC thermistor switch regulates a flow of current through the layer stack by the series connection and the increasing electric resistance. The PTC thermistor switch can include, for example, a polycrystalline barium titanite ceramics, in particular $BaTiO_3$, wherein the ceramic can be p-doped or n-doped.

The series connection can be implemented within the optoelectronic component by means of conductor paths on or in the substrate, for example.

The conductor paths between the electrothermal protection element and the layer stack can likewise partially border the heat-conducting element, i.e., be in direct mechanical contact thereto. As an alternative, the conductor paths are arranged at a distance to the heat-conducting element, for example, embedded in the substrate, such that no heat is transferred to the conductor paths and transported away from them by means of the heat-conducting element.

According to at least one embodiment of the optoelectronic component, the PTC thermistor switch is configured to decrease or interrupt a current flowing through the light-emitting layer stack during operation of the light-emitting layer stack if a threshold temperature $T_{crit}$ is exceeded at the PTC thermistor switch.

By means of the PTC thermistor switch, the current flow on the layer stack can be controlled depending on the temperature at the PTC thermistor switch, with the switch advantageously connected in series with the layer stack in such a way, that the light emission at the layer stack is advantageously dimmed or adjusted if a threshold temperature $T_{crit}$ at the PTC thermistor switch is exceeded. In order to decrease the current through the layer stack as the resistance of a PTC thermistor switch increases, voltage must be kept constant at the layer stack. This can advantageously be affected by re-adjustment at a voltage source to which the optoelectronic component is connected.

According to at least one embodiment of the optoelectronic component, the electrothermal protection element includes an NTC thermistor switch connected in parallel to the layer stack.

An NTC thermistor switch is characterized by being electrically-conductive when a temperature of the NTC thermistor switch is higher than a predetermined temperature value. Advantageously, an NTC thermistor switch is conductive for temperatures of more than 120° C., preferably of higher than 100° C., and particularly preferably of more than 85° C.

In other words, the NTC thermistor switch has a temperature-dependent electric resistance that decreases as the temperature increases. When exceeding a critical temperature at the NTC thermistor, a flow of current through the layer stack can be regulated by means of the parallel connection and the increasing electric resistance. The NTC thermistor switch can include polycrystalline barium titanite ceramics, for example. Here, the conductivity of the layer stack can advantageously be influenced by a material thickness of the material used in the NTC thermistor.

The parallel connection can be implemented within the optoelectronic component by means of conductor paths on or in the substrate, for example.

According to at least one embodiment of the optoelectronic component, the NTC thermistor switch is configured to deflect a current flowing through the light-emitting layer stack via the NTC thermistor switch and to decrease the current at the layer stack when a threshold temperature $T_{crit}$ is exceeded at the NTC thermistor switch.

By means of the NTC thermistor switch advantageously connected in parallel with the layer stack, the flow of current at the layer stack can be controlled depending on the temperature in such a way, that the emission of light at the layer stack is advantageously dimmed or adjusted if a threshold temperature $T_{crit}$ at the NTC thermistor switch is exceeded. Along with a decreasing electric resistance of the NTC thermistor switch, the electric conductivity of the NTC thermistor switch improves, and another current path opens in parallel connection to the layer stack, through which the current can be guided in parallel past the layer stack. The layer stack advantageously acts as a diode, such that essentially no current flows through the layer stack if a minimum voltage required in operation of the layer stack is not reached at the layer stack.

The critical temperature is, for example, between 40° C. and 85° C. inclusive, or between 85° C. and 100° C., or between 100° C. and 120° C. When exceeding the critical temperature, the flow of current through the light-emitting layer stack is reduced by at least 50%, or by at least 80%, or by at least 90%, or by at least 95%, for example.

According to at least one embodiment of the optoelectronic component, the layer stack includes the electrothermal protection element in the form of a switch layer integrated into the layer stack.

By means of the switch layer integrated into the layer stack, which acts as an electrothermal protection element, the optoelectronic component, advantageously an OLED, can per se initiate its own deactivation as soon as a critical heating of the layer stack is reached. The switch layer can be integrated into the layer stack at a location between an anode contact and a cathode contact of the layer stack during the production of the layer stack. External circuits for dimming the emitted light or for turning-off the optoelectronic component as well as active cooling means, such as external cooling bodies or fans, can therefore be dispensed with. As a result, advantageously, the design of the optoelectronic component can be maintained.

A layer stack with an integrated switch layer can advantageously also be connected with further electrothermal protection elements arranged internally within the component. In this way, the layer stack having an integrated switch layer can be connected in parallel and/or in series with a PTC thermistor switch and/or NTC thermistor switch arranged on the common substrate.

According to at least one embodiment of the optoelectronic component, a charge carrier mobility of the switch layer decreases as a temperature of the switch layer increases.

According to at least one embodiment of the optoelectronic component, the switch layer is formed in such a way, that a minimum voltage $U_{min}$ required for operation of the layer stack increases along with an increasing temperature of the switch layer in the layer stack.

Depending on the material, the charge carriers can be electrons or holes. As a result, the switch layer has only a low electrically-conductive effect at high temperatures, advantageously, it is insulating. As a result, a threshold for the temperature can be determined for the material used in the switch layer, above which the layer stack does not emit light any more at a predetermined operating voltage. As a consequence of the decreasing charge carrier mobility, a minimum voltage $U_{min}$ at the layer stack which is required in order for the charge carriers to be still able to move through the switch layer advantageously increases significantly. With decreasing mobility of the charge carriers and a therefore increasing temperature at the layer stack, this results in an increase of the minimum voltage $U_{min}$ required for operation of the layer stack. As a consequence, it is advantageously not necessary to measure the temperature at the layer stack and to interrupt the flow of current through the layer stack by means of an external circuit.

By means of the material composition of the switch layer, the critical temperature can be adjusted to a predetermined threshold value. Accordingly, operation of the component is automatically stopped above the threshold. As soon as the temperature at the layer stack drops below the threshold again, the applied voltage is advantageously sufficient to re-operate the layer stack, such that this layer stack can emit light again. Advantageously, the temperature of the layer stack is composed of the ambient temperature and the intrinsic heat-up of the layer stack. If the temperature exceeds a threshold, emission at the layer stack is advantageously deactivated and the temperature of the layer stack adapts to the ambient temperature again, due to the fact that the layer stack does not produce intrinsic heat-up anymore.

According to at least one embodiment of the optoelectronic component, the switch layer includes a thermo-material.

Advantageously, thermo-materials are materials changing their structure reversibly with the temperature in a temperature change. This results in changes, e.g., in the absorption properties and the charge carrier mobility of the material. Along with an increasing temperature, it is possible for a thermo-material with a high charge carrier mobility to convert into a material with low charge carrier mobility, for example. If a switch layer in a light-emitting layer stack comprises such a thermo-material with a charge carrier mobility decreasing during a heat-up, the minimum voltage $U_{min}$ required for operation of the layer stack increases. Advantageously, the switch layer includes a thermo-material consisting of multiple species present in a temperature-dependent equilibrium. Depending on the thermo-material, the charge carriers, the mobility of which changes with temperature, can be electrons or holes. When reversing the temperature, the process is reversible and the material having the low charge carrier mobility re-converts into a material of high charge carrier mobility, with the minimum voltage $U_{min}$ for operating the layer stack decreasing.

Advantageously, a hole transport layer as well as an electron transport layer can be formed as a switch layer by means of a thermo-material.

According to at least one embodiment of the optoelectronic component, the switch layer is formed in such a way, that the minimum voltage $U_{min}$ increases exponentially with the temperature of the layer stack.

The content of altered material contents in a layer of thermo-material can, e.g., change exponentially with the temperature (Arrhenius activation). Concerning a material, e.g., having high electron mobility at low temperatures, regions of the thermo-material change in such a way, that the proportion of charge carrier transport within the thermo-material by means of already structurally-altered portions of the material increases exponentially with the temperature. In other words, the number of already structurally-altered regions having a low electron mobility increases with the temperature. Advantageously, this results in an exponential increase of the minimum voltage $U_{min}$.

In a method for operating an optoelectronic component, the electrothermal protection element decreases or interrupts an emission of light at the light-emitting layer stack, if a temperature of the light-emitting layer stack exceeds a threshold temperature $T_{crit}$.

Advantageously, the voltage at the layer stack is the characteristic parameter for turning-off the operation of the light-emitting layer stack. Advantageously, no temperature sensor is required here to adjust operation at the layer stack. The threshold temperature $T_{crit}$ is 80° C., for example.

The electrothermal protection element can control operation of the component automatically, in particular, dim or turn-off the emission of light at the layer stack. This is advantageously achieved in that the electric control of the component, e.g., an operating current applied to the layer stack, is controlled depending on the temperature in the layer stack.

BRIEF DESCRIPTION OF THE DRAWINGS

Further advantages, advantageous embodiments and developments result from the exemplary embodiment described in the following in conjunction with the figures.

In the exemplary embodiments and figures, similar or similarly acting constituent parts are provided with the same reference symbols. The elements illustrated in the figures and their size relationships among one another should not be regarded as true to scale, unless otherwise indicated. Rather, individual elements may be represented with an exaggerated size for the sake of better representability and/or for the sake of better understanding.

DETAILED DESCRIPTION OF ILLUSTRATIVE EMBODIMENTS

Figure 1A:
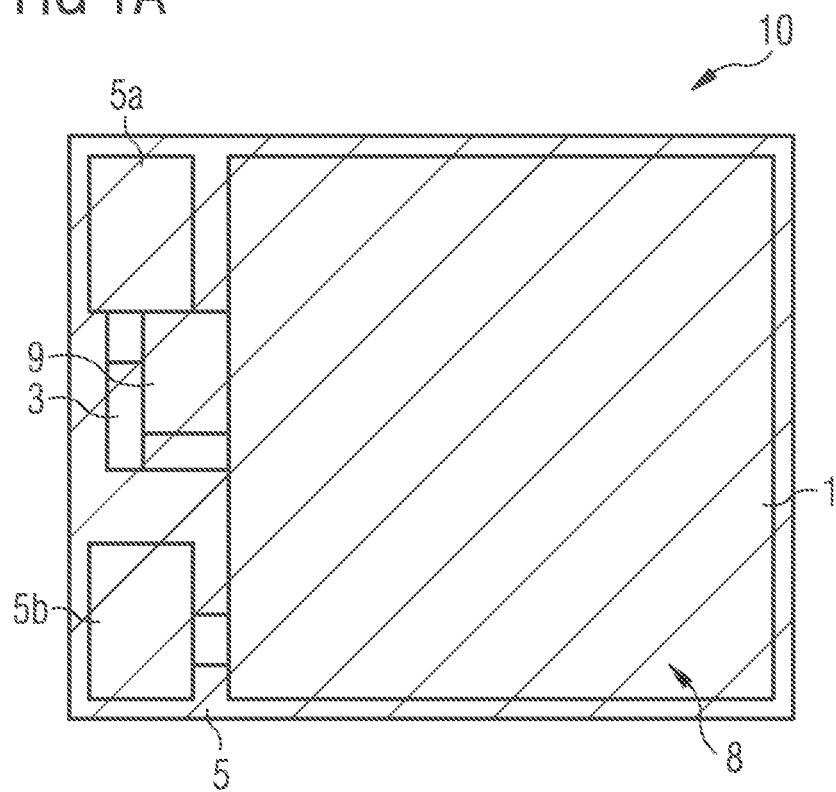
FIGS. 1A and 2A show a schematic top view of an optoelectronic component with an electrothermal protection element.

FIG. 1A schematically shows a top view of an optoelectronic component 10. A light-emitting layer stack 1 and an electrothermal protection element 3 are commonly arranged on a substrate 5 and internally connected on the substrate 5 by means of electrical conductor paths. The electrothermal protection element 3 of FIG. 1A advantageously is a PTC thermistor switch connected in series with the layer stack 1. The PTC thermistor switch can be applied on to the substrate 5 in a manner to be spaced laterally from the layer stack 1, for example.

The substrate 5 furthermore has an anode contact 5a and a cathode contact 5b arranged thereon for external contacting, by means of which the PTC thermistor switch and the layer stack 1 are advantageously connected in series.

Furthermore, a heat-conducting element 9 is commonly arranged on the substrate 5 together with the electrothermal protection element 3 and the layer stack 1. The heat-conducting element 9 is located between the layer stack 1 and the electrothermal protection element 3 here, and is in direct contact to both of them, such that the heat of the layer stack 1 can be transmitted to the PTC thermistor switch advantageously in a good manner.

An encapsulation 8 (striped representation) covers the layer stack 1, the electrothermal protection element 3 and the substrate 5 and encapsulates the individual components to form an optoelectronic component 10.

Figure 1B:
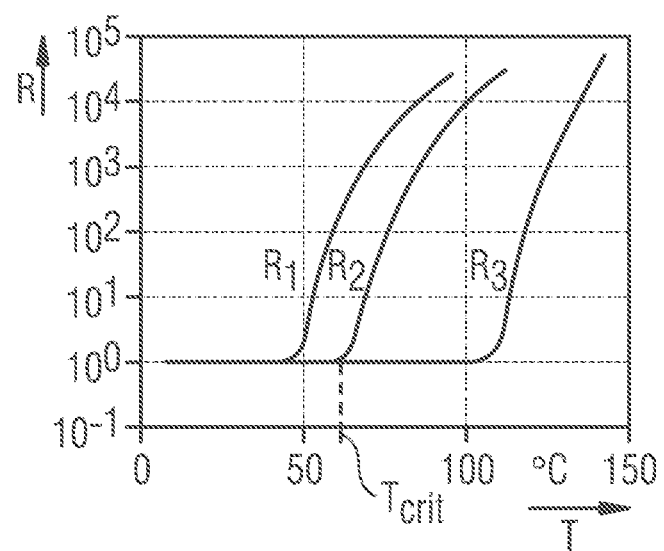
FIGS. 1B and 2B show a typical curve of an electric resistance of the electrothermal protection element depending on the temperature.

FIG. 1B shows a dependency of the electric resistance R of a PTC thermistor switch from the temperature T on the PTC thermistor switch for three different PTC thermistor switches R1, R2 and R3. The electric resistance of PTC thermistor switch R1 increases sharply from a critical temperature $T_{crit}$ of 40° C. The PCT thermistor switches R2 and R3 have their resistance increasing sharply at 60° C. and 120° C., respectively. Prior to the increase, the resistance remains largely constant with the increase in temperature.

If a PTC thermistor switch having such a characteristic according to FIG. 1A is connected in series with a layer stack, advantageously an OLED, and if the voltage at the OLED is maintained constant, e.g., by means of an external voltage source, the current by means of which the layer stack is operated decreases. An OLED is automatically dimmed or turned-off thereby if the temperature exceeds a critical temperature $T_{crit}$, above which the electrical resistance increases sharply.

Figure 2A:
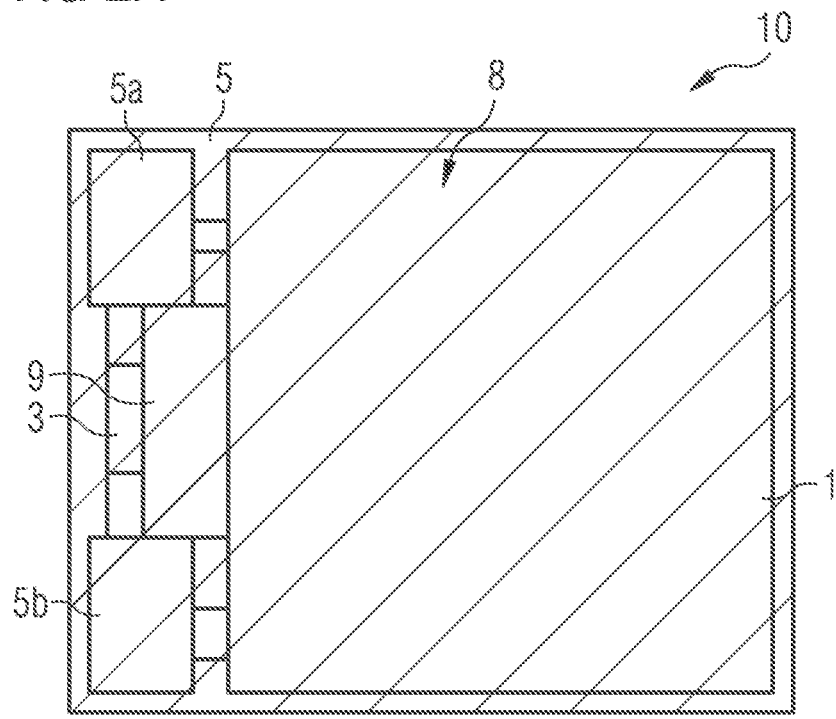

FIG. 2A schematically shows an optoelectronic component 10 similar to FIG. 1A in a top view. A light-emitting layer stack 1 and an electrothermal protection element 3 are commonly arranged on a substrate 5 and internally connected in the component 10 on the substrate 5 by means of electrical conductor paths, wherein, advantageously, the electrothermal protection element 3 in FIG. 2A is a NTC thermistor switch connected in parallel with the layer stack 1.

A heat-conducting element 9 is arranged on the substrate 5 together with the electrothermal protection element 3 and the layer stack 1. The heat-conducting element 9 is located between the layer stack 1 and the NCT thermistor switch and is in direct contact to both of them, such that the heat of the layer stack 1 can be transmitted to the NCT thermistor switch advantageously in a good manner. An encapsulation 8 (striped representation) covers the NTC thermistor switch 3, the substrate 5 and the layer stack 1, which is advantageously formed as an OLED.

Figure 2B:
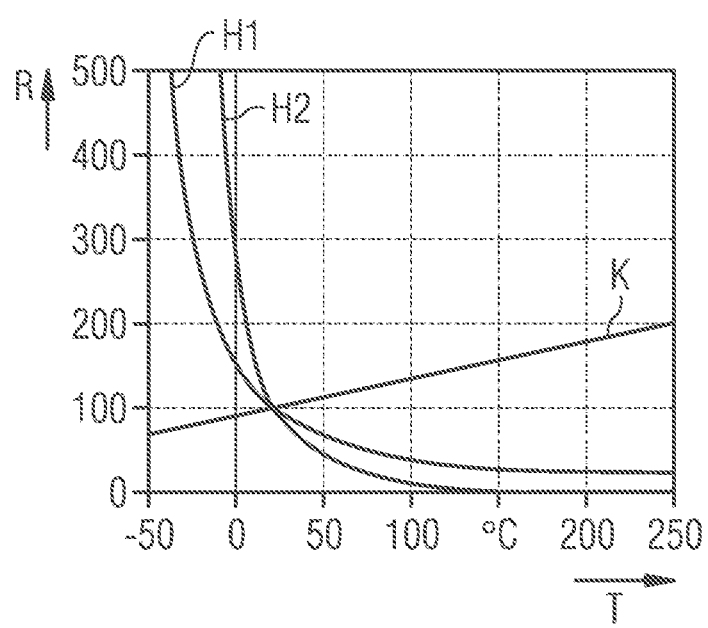

FIG. 2B shows a dependency of the electric resistance R of an NTC thermistor switch from the temperature T at the NTC thermistor switch for two different NTC thermistor switches H1 and H2 in comparison to a copper wire K. As the temperature increases, the electric resistances of the NTC thermistor switches H1 and H2 asymptomatically approach a minimum value. In parallel connection with the layer stack, this results in a parallel current path to open, and the current at the layer stack 2 of FIG. 2A can be decreased.

Figure 3A:
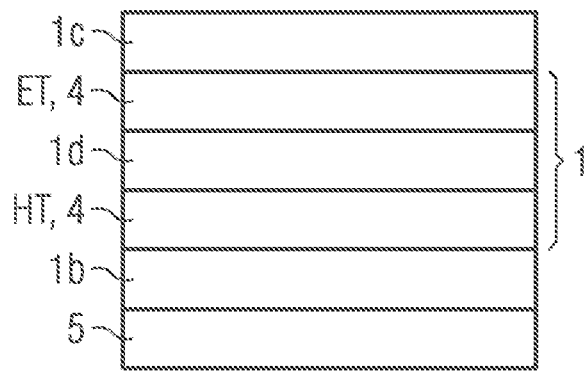
FIG. 3A shows a schematic side view of a layer stack having a switch layer.

FIG. 3A shows a layer stack 1 including a switch layer 4 in a schematic side view. The layer stack 1 further includes a first contact 1B, a second contact 1c and, e.g., an emission unit 1d. The emission unit 1d can advantageously be configured as an active zone. In FIG. 3A, the layer stack 1 further includes an electron transport layer ET and a hole transport layer HT, with the emission unit 1d being arranged between the electron transport layer ET and the hole transport layer HT. The switch layer 4 can be the electron transport layer and/or the hole transport layer.

Figure 3B:
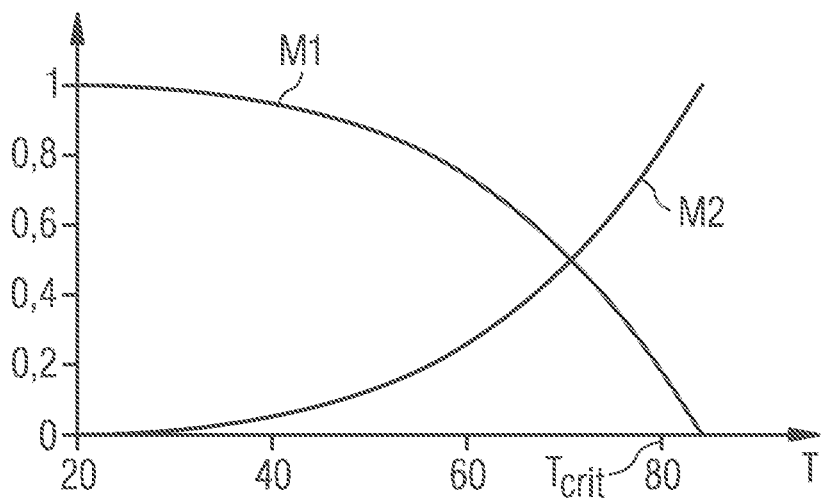
FIG. 3B shows an exemplary charge carrier transport of a thermo-material depending on the temperature.

FIG. 3B shows a change in the proportion of thermomaterial, which changes its structure and thus the extent of charge carrier transport as the temperature T increases. Along with an increase in temperature, part of the material in a layer of thermo-material changes from a first species M1 of high hole mobility to a second species M2 of low hole mobility, for example. As the temperature increases, the proportion of charge carrier transport of the entire layer is exponentially reduced for the first species and exponentially increased for the second species. Above a critical temperature $T_{crit}$, e.g., 80° C., the proportion of the charge carrier transport by the second species is so large that a voltage initially applied to the layer is no longer sufficient for the layer to have an electrically-conductive effect sufficient for the operation of an OLED.

Figure 3C:
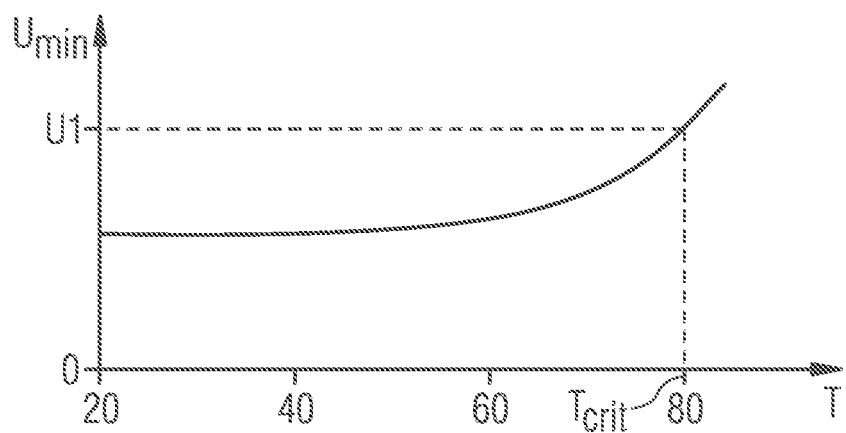
FIG. 3C shows a curve of a minimum voltage for operating a layer stack having a switch layer depending on the temperature.

FIG. 3C shows an increase of the minimum voltage $U_{min}$ with the temperature T. When the minimum voltage $U_{min}$ reaches a threshold value U1 at a critical temperature $T_{crit}$, operation at the layer stack is automatically turned-off. The voltage curve of the minimum voltage $U_{min}$ increases exponentially as the temperature increases. In OLEDs, the critical temperature advantageously is 80° C.

Figure 4:
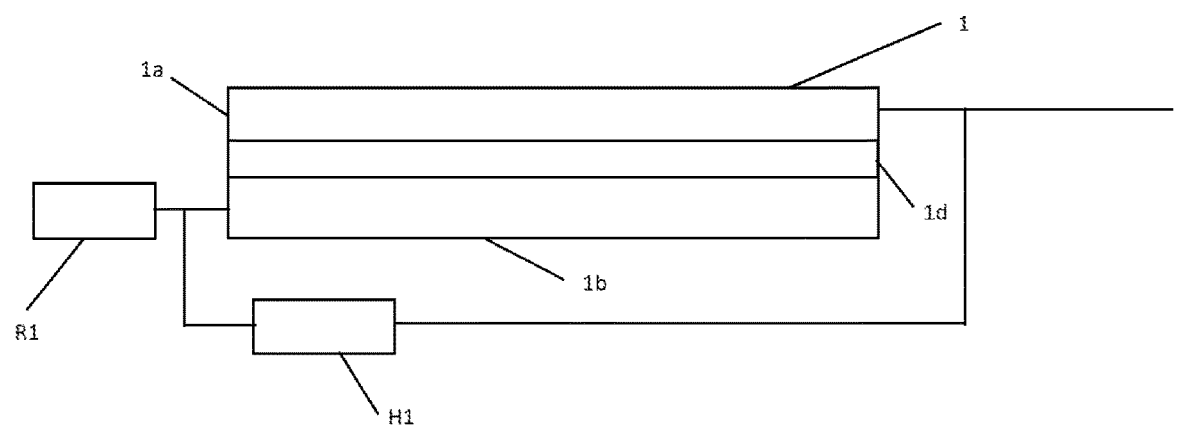
FIG. 4 shows an optoelectronic component according to an embodiment.

FIG. 4 shows an optoelectronic component. The optoelectronic component may include a light-emitting layer stack 1 including organic layers and an electrothermal protection element connected to the layer stack 1, wherein the electrothermal protection element has a temperature-dependent resistance, wherein the electrothermal protection element includes a PTC thermistor switch $R_1$ and a NTC thermistor switch $H_1$, wherein the PTC thermistor switch $R_1$ is connected in series with the layer stack, wherein the NTC thermistor switch $H_1$ is connected in parallel with the layer stack, and wherein the electrothermal protection element is configured to decrease or interrupt an emission of light at the light-emitting layer stack 1 when a temperature of the light-emitting layer stack 1 exceeds a threshold temperature $T_{crit}$.

The invention is not limited to the exemplary embodiments by the description by means of these exemplary embodiments. The invention rather comprises every new feature as well as every combination of features, which in particular includes any combination of features in the claims, even if this feature of this combination is per se not explicitly stated in the claims or the exemplary embodiments.

The invention claimed is:

1. An optoelectronic component comprising:
 a light-emitting layer stack including organic layers; and
 an electrothermal protection element connected to the layer stack,
 wherein the electrothermal protection element has a temperature-dependent resistance,
 wherein the electrothermal protection element includes a PTC thermistor switch and a NTC thermistor switch,
 wherein the PTC thermistor switch is connected in series with the layer stack,
 wherein the NTC thermistor switch is connected in parallel with the layer stack, and
 wherein the electrothermal protection element is configured to decrease or interrupt an emission of light at the light-emitting layer stack when a temperature of the light-emitting layer stack exceeds a threshold temperature $T_{crit}$.

2. The optoelectronic component according to claim 1, wherein the electrothermal protection element and the light-emitting layer stack are commonly arranged on a substrate and covered by a common encapsulation.

3. The optoelectronic component according to claim 1, further comprising a heat-conducting element commonly arranged on a substrate between the layer stack and the electrothermal protection element.

4. The optoelectronic component according to claim 3, wherein the heat-conducting element is arranged on the substrate and in lateral direction between the electrothermal protection element and the light-emitting layer stack, and/or wherein the heat-conducting element is in direct mechanical contact with the light-emitting layer stack and the electrothermal protection element, and/or wherein the heat-conducting element comprises a metal.

5. The optoelectronic component according to claim 1, wherein the PTC thermistor switch is configured to decrease or interrupt a current flowing through the light-emitting layer stack during operation of the light-emitting layer stack when the threshold temperature $T_{crit}$ at the PTC thermistor switch is exceeded.

6. The optoelectronic component according to claim 1, wherein the NTC thermistor switch is configured to deflect a current flowing through the light-emitting layer stack during operation of the light-emitting layer stack via the NTC thermistor switch and to decrease the current at the layer stack when the threshold temperature $T_{crit}$ at the NTC thermistor switch is exceeded.

7. A method for operating an optoelectronic component according to claim 1, the method comprising:
   decreasing or interrupting, by the electrothermal protection element, the emission of light at the light-emitting layer stack when the temperature of the light-emitting layer stack exceeds the threshold temperature $T_{crit}$.

8. The optoelectronic component according to claim 3, wherein the heat-conducting element is arranged on the substrate and in lateral direction between the electrothermal protection element and the light-emitting layer stack, wherein the heat-conducting element is in direct mechanical contact with the light-emitting layer stack and the electrothermal protection element, and wherein the heat-conducting element comprises a metal.

9. The optoelectronic component according to claim 3, wherein the heat-conducting element is arranged on the substrate and in lateral direction between the electrothermal protection element and the light-emitting layer stack, and wherein the heat-conducting element is in direct mechanical contact with the light-emitting layer stack and the electrothermal protection element.

10. The optoelectronic component according to claim 3, wherein the heat-conducting element is in direct mechanical contact with the light-emitting layer stack and the electrothermal protection element, and wherein the heat-conducting element comprises a metal.

11. The optoelectronic component according to claim 3, wherein the heat-conducting element is arranged on the substrate and in lateral direction between the electrothermal protection element and the light-emitting layer stack, and wherein the heat-conducting element comprises a metal.

* * * * *